(12) United States Patent
Yoshida et al.

(10) Patent No.: US 11,314,165 B2
(45) Date of Patent: Apr. 26, 2022

(54) FORMING APPARATUS AND METHOD OF MANUFACTURING ARTICLE

(71) Applicant: CANON KABUSHIKI KAISHA, Tokyo (JP)

(72) Inventors: Setsuo Yoshida, Saitama (JP); Tosiya Asano, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 42 days.

(21) Appl. No.: 16/591,962

(22) Filed: Oct. 3, 2019

(65) Prior Publication Data
US 2020/0110333 A1 Apr. 9, 2020

(30) Foreign Application Priority Data
Oct. 9, 2018 (JP) .............................. JP2018-191272

(51) Int. Cl.
*G03F 7/00* (2006.01)
*B29C 33/42* (2006.01)

(52) U.S. Cl.
CPC .......... *G03F 7/0002* (2013.01); *B29C 33/424* (2013.01); *G03F 7/0022* (2013.01); *B29C 2033/426* (2013.01)

(58) Field of Classification Search
CPC ............. B29C 33/424; B29C 2033/426; G03F 7/0002; G03F 7/0022
See application file for complete search history.

(56) References Cited

U.S. PATENT DOCUMENTS

2007/0114686 A1 5/2007 Choi
2016/0297136 A1* 10/2016 Wakabayashi .......... B29C 64/20

* cited by examiner

*Primary Examiner* — Ryan M Ochylski
(74) *Attorney, Agent, or Firm* — Rossi, Kimms & McDowell LLP (57) ABSTRACT

The present invention provides a forming apparatus that forms a composition on a substrate using a mold including a contact region to be brought into contact with the composition, comprising: a deformation unit configured to deform the contact region; and a controller configured to perform, for each of a first shot region and a second shot region on the substrate, a process of bringing the contact region and the composition on the substrate into contact with each other while controlling the deformation of the contact region, wherein an area where the mold faces the substrate during the process is different between the first and second shot regions, and wherein the controller is configured to change, between the first and second shot regions, a process condition for bringing the contact region and the composition into contact with each other.

16 Claims, 8 Drawing Sheets

FORMING APPARATUS AND METHOD OF MANUFACTURING ARTICLE

BACKGROUND OF THE INVENTION

Field of the Invention

The present invention relates to a forming apparatus and a method of manufacturing an article.

Description of the Related Art

An imprint apparatus that forms the pattern of an imprint material on a substrate using a mold including a pattern region with an uneven pattern formed thereon has received attention as one type of forming apparatus for forming a composition on a substrate in a manufacturing process of a semiconductor device or the like. In the imprint apparatus, if bubbles remain between the mold and the substrate when the mold is in contact with the imprint material on the substrate, a defect can occur in the pattern of the imprint material formed on the substrate. US-2007-0114686 discloses a method of deforming a mold (pattern region) into a shape bent toward a substrate and bringing the mold into contact with an imprint material on the substrate while controlling the deformation of the mold. According to this method, the mold and the imprint material can be gradually brought into contact with each other from the central portion of the mold toward the outside so as to extrude a gas between the mold and the substrate to the outside, so that it is possible to reduce bubbles remaining between the mold and the substrate.

Among a plurality of shot regions on the substrate, between the shot regions having different facing areas between the mold and the substrate during a contact process of the mold and the imprint material, a pressure applied to the mold during the contact process can change due to the air pressure in a space under the mold. As a result, since the shape of the mold during the contact process differs between the shot regions, the tendency of remaining bubbles between the mold and the substrate changes, and it can be difficult to reduce the remaining bubbles in some shot regions.

SUMMARY OF THE INVENTION

The present invention provides, for example, an imprint apparatus that is advantageous in reducing bubbles remaining between a mold and a substrate.

According to one aspect of the present invention, there is provided a forming apparatus that forms a composition on a substrate using a mold including a contact region to be brought into contact with the composition, comprising: a deformation unit configured to deform the contact region so as to bend toward the substrate by applying a force to the mold; and a controller configured to perform, for each of a plurality of shot regions on the substrate, a process of bringing the contact region and the composition on the substrate into contact with each other while controlling the deformation of the contact region by the deformation unit, wherein the plurality of shot regions includes a first shot region and a second shot region each of which the entire contact region contacts, and an area where the mold faces the substrate during the process is different between the first shot region and the second shot region, and wherein the controller is configured to change, between the first shot region and the second shot region, a process condition for bringing the contact region and the composition on the substrate into contact with each other.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. Note that the same reference numerals denote the same members throughout the drawings, and a repetitive description thereof will not be given.

First Embodiment

An imprint apparatus 1 of this embodiment according to the present invention will be described. In general, an imprint apparatus brings an imprint material supplied on a substrate into contact with a mold and applies curing energy to the imprint material, thereby forming the pattern of a cured product to which the uneven pattern of the mold is transferred. The imprint apparatus 1 of this embodiment is used for manufacturing a semiconductor device or the like, and performs an imprint process to, using a mold 3 with an uneven pattern formed thereon, transfer the pattern to an imprint material supplied on the shot region of a substrate 5. For example, the imprint apparatus 1 cures the imprint material while the mold 3 with the pattern formed thereon is in contact with the imprint material on the substrate. Then, the imprint apparatus 1 can form the pattern of the imprint material on the substrate by increasing the interval between the mold 3 and the substrate 5 and separating the mold 3 from the cured imprint material.

As the imprint material, a curable composition (to be also referred to as a resin in an uncured state) to be cured by receiving curing energy is used. Examples of the curing energy are an electromagnetic wave, heat, and the like. The electromagnetic wave is, for example, light selected from the wavelength range of 10 nm (inclusive) to 1 mm (inclusive). Examples of the electromagnetic wave are infrared light, a visible light beam, and ultraviolet light.

The curable composition is a composition cured with light irradiation or heating. Among these compositions, the photo-curable composition cured by light contains at least a polymerizable composition and a photopolymerization initiator, and may contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component.

The imprint material is applied in a film shape onto the substrate by a spin coater or a slit coater. Alternatively, the imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

As the substrate 5, glass, ceramic, a metal, a semiconductor, a resin, or the like is used. A member made of a material different from that of the substrate may be formed on the surface of the substrate. More specifically, the substrate 5 is a silicon wafer, a semiconductor compound wafer, silica glass, or the like. In addition, an adhesion layer may be provided to improve the adhesion between the imprint material and the substrate, as needed, before supply of the imprint material.

Arrangement of Imprint Apparatus

Figure 1:
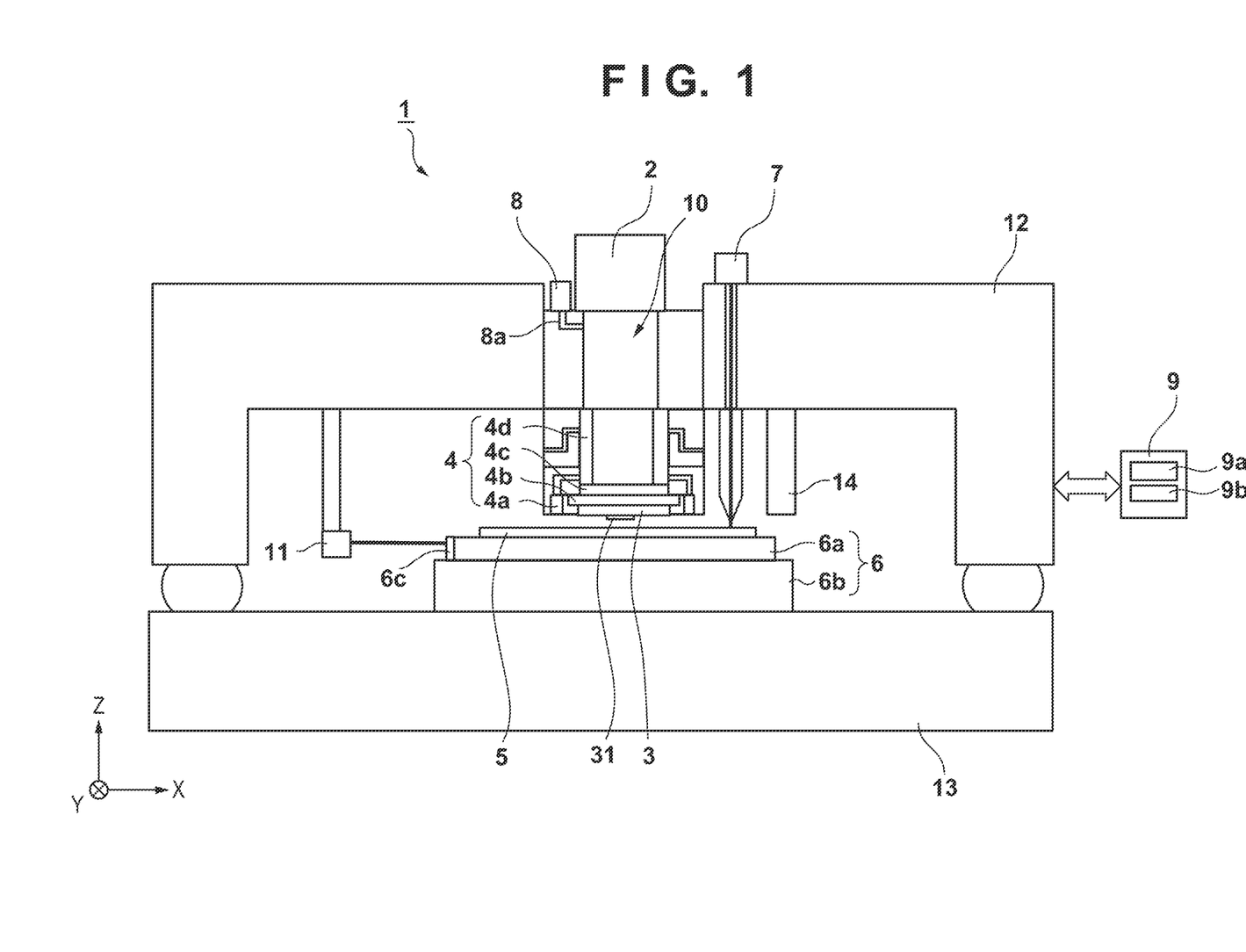
FIG. 1 is a view schematically showing the arrangement of an imprint apparatus.

FIG. 1 is a view schematically showing the arrangement of the imprint apparatus 1 of this embodiment. Although the imprint apparatus 1 employs a photo-curing method of curing an imprint material with irradiation of light (ultraviolet light) in this embodiment, it is not limited to this, and can employ a heat-curing method of curing an imprint material by application of heat. Note that in each of the following drawings, the Z axis in the XYZ coordinate system is taken in a direction parallel to the irradiation axis of light (ultraviolet light) to the mold 3, and the X- and Y-axes are taken in directions perpendicular to each other in a plane perpendicular to the Z-axis.

The imprint apparatus 1 can include, for example, an illumination unit 2, an imprint head 4 for holding the mold 3, a substrate stage 6 that can move while holding the substrate 5, a dispenser 7 (supply unit) for supplying an imprint material onto the substrate, a deformation unit 8, and a control unit 9 (a controller). The illumination unit 2, imprint head 4, and the dispenser 7 are supported by a structure 12. The control unit 9 includes, for example, a CPU 9a, a memory 9b, and the like, and comprehensively controls the respective units of the imprint apparatus 1 (controls an imprint process).

During the imprint process, the illumination unit 2 irradiates the mold 3 and the imprint material on the substrate with ultraviolet light via an opening 10 formed in the structure 12 and the imprint head. The illumination unit 2 can include, for example, a light source and an illumination optical system for adjusting the ultraviolet light emitted from the light source to light optimum for the imprint process. The illumination optical system can include an optical element such as a lens, an aperture (opening), a shutter that switches between irradiation and light shielding, and the like.

The imprint head 4 includes a shape correction mechanism 4a (magnification correction mechanism), a mold chuck 4b, a horizontal driving mechanism 4c, and a vertical driving mechanism 4d, and functions as a mold holding unit that can move while holding the mold 3. The shape correction mechanism 4a includes a plurality of fingers each arranged so as to face a region on the outer peripheral side surface of the mold 3, and corrects the shape of a pattern region 31 of the mold 3 to a target shape by driving these fingers to apply a compression force to the mold 3. Here, the arrangement of the shape correction mechanism 4a is not limited to this, and may be configured to apply a tensile force to the mold 3, for example. Alternatively, the mold chuck 4b itself may be driven to apply a shearing force to the contact surface between the mold 3 and the mold chuck 4b.

The mold chuck 4b attracts and holds the mold 3 with a vacuum attraction force, an electrostatic attraction force, or the like. The horizontal driving mechanism 4c is a driving system for driving the mold chuck 4b (that is, the mold 3) in the X and Y directions, and the vertical driving mechanism 4d is a driving system for driving the mold chuck 4b (that is, the mold 3) in the Z direction. Each of the horizontal driving mechanism 4c and the vertical driving mechanism 4d can employ an actuator such as a linear motor or an air cylinder. The vertical driving mechanism 4d may be configured to have an adjustment function of adjusting the position of the mold 3 in the 0 direction (the rotational direction around the Z-axis), a tilt function of adjusting the tilt of the mold 3, or the like.

The mold 3 held by the imprint head 4 (mold chuck 4b) has, for example, a substantially rectangular outer shape, and is usually forming from a material capable of transmitting ultraviolet light, such as quartz. The surface (pattern surface) of the mold 3 on the substrate side is formed in a mesa shape having a level difference of, for example, about several tens of μm, and a contact region to be brought into contact with the imprint material on the substrate is provided. In the mold 3 used in the imprint apparatus 1 of this embodiment, the contact region is the pattern region 31 in which an uneven pattern to be transferred to the imprint material on the substrate is formed as a device pattern (circuit pattern). On the other hand, in a mold used in a planarizing apparatus, the contact region can be a flat surface without an uneven pattern formed thereon. Further, in the mold 3, in order to facilitate the deformation of the pattern region 31, a cavity 32 (concave portion) is formed on the surface opposite to the pattern surface to decrease the thickness in the pattern region 31 and its periphery. When the mold 3 is held by the imprint head 4, the cavity 32 becomes a substantially sealed space. The cavity 32 is connected to the deformation unit 8 via a pipe 8a.

The deformation unit 8 applies a force to the mold 3, thereby deforming the pattern region 31 of the mold 3 so as to bend toward the substrate 5. More specifically, the deformation unit 8 changes the pressure in the cavity 32 of the mold 3 held by the imprint head 4, thereby deforming the pattern region 31 of the mold 3 into a convex shape so as to bend and have its central portion protruding toward the substrate 5. For example, when bringing the mold 3 and the substrate 5 close to each other to bring the mold 3 and the imprint material on the substrate into contact with each other, the deformation unit 8 supplies compressed air to the inside of the cavity 32 through the pipe 8a, thereby making the pressure inside the cavity 32 higher than the external pressure. This makes it possible to deform the pattern region 31 of the mold 3 into a convex shape, and gradually bring the mold 3 into contact with the imprint material from the central portion toward the outside. As a result, it is possible to reduce bubbles remaining between the mold 3 and the substrate 5, and reduce a defect in the pattern formed on the imprint material by the imprint process.

The substrate stage 6 includes, for example, a substrate chuck 6a and a substrate driving unit 6b, and is configured to be movable while holding the substrate 5. The substrate chuck 6a attracts and holds the substrate 5 with, for example, a vacuum attraction force, an electrostatic attraction force, or the like. The substrate driving unit 6b is a driving system for driving the substrate chuck 6a (that is, the substrate 5) in the X and Y directions on a platen 13. The substrate driving unit 6b may be configured to have an adjustment function of adjusting the position of the substrate 5 in the Z direction or θ direction (the rotational direction around the Z-axis), a tilt function of adjusting the tilt of the substrate 5, or the like.

The position of the substrate stage 6 in the X and Y directions is measured by a measurement unit 11. The measurement unit 11 includes, for example, an interferometer supported by the structure 12, and can measure the position of the substrate stage 6 by radiating measurement light toward a mirror 6c provided in the end portion of the substrate chuck 6a and detecting the measurement light reflected by the mirror 6c. Although only one measurement unit 11 is shown in FIG. 1, for example, a plurality of measurement units 11 may be provided to measure the position in the X and Y directions, rotation amount, and tilt amount of the substrate stage 6.

Here, the imprint apparatus 1 can obtain information on misalignment between the mold 3 and the substrate 5 by observing an alignment mark formed on the substrate 5 (or the substrate chuck 6a) via the mold 3 by an alignment optical system (not shown). Further, the imprint apparatus 1 can measure a distance to the upper surface of the substrate 5 by a height measurement unit 14. Since information on the relative height between the pattern surface of the mold 3 and the height measurement unit 14 is obtained in advance, it is possible to calculate the distance between the pattern surface of the mold 3 and the upper surface of the substrate 5 based on the measurement result by the height measurement unit 14 and the information.

The imprint apparatus 1 configured as described above performs an imprint process for each of the plurality of shot regions on the substrate 5. In an imprint process, after the imprint material is supplied by the dispenser 7 onto a shot region (target shot region) to be processed among the plurality of shot regions, a contact process for bringing the mold 3 and the imprint material on the target shot region into contact with each other is performed. The contact process can also be referred to as a pressing process for pressing the mold 3 against the imprint material on the target shot region.

In the contact process, the control unit 9 first causes the deformation unit 8 to deform the pattern region 31 of the mold 3 into a convex shape so as to bend toward the substrate 5. Then, while controlling the deformation of the pattern region 31 by the deformation unit 8, the mold 3 is driven by the imprint head 4 so as to decrease the interval between the mold 3 and the substrate 5. At this time, the control unit 9 controls the force applied to the mold 3 (that is, the force applied to the cavity 32 of the mold 3) by the deformation unit 8 such that the pattern region 31 (pattern surface) has a planar shape when the entire pattern region 31 is in contact with the imprint material. With this operation, it is possible to gradually bring the pattern region 31 of the mold 3 into contact with the imprint material from the central portion of the pattern region 31, and reduce bubbles remaining between the mold 3 and the substrate 5.

Here, the imprint apparatus 1 according to this embodiment is configured to drive the mold 3 in the Z direction by the imprint head 4 with respect to the fixed substrate 5 to bring the mold 3 and the imprint material on the substrate into contact with each other. However, the reverse configuration may be possible. That is, the substrate 5 may be driven in the Z direction by the substrate stage 6 with respect to the fixed mold 3 to bring the mold 3 and the imprint material on the substrate into contact with each other. Alternatively, the mold 3 and the substrate 5 may be relatively driven in the Z direction by the imprint head 4 and the substrate stage 6, respectively, to bring the mold 3 and the imprint material on the substrate into contact with each other. That is, any configuration may be employed as long as the interval between the mold 3 and the substrate 5 is relatively changed.

Remaining of Bubbles

Among the plurality of shot regions on the substrate 5, between the shot regions having different facing areas between the mold 3 and the substrate 5 during a contact process, a pressure applied to the mold 3 during the contact process can change due to the air pressure in a space under the mold 3. As a result, since the shape of the mold during the contact process differs between the shot regions, the tendency of remaining bubbles between the mold 3 and the substrate 5 changes, and it can be difficult to reduce remaining bubbles in some shot regions. The reason will be described below.

Figure 2A:
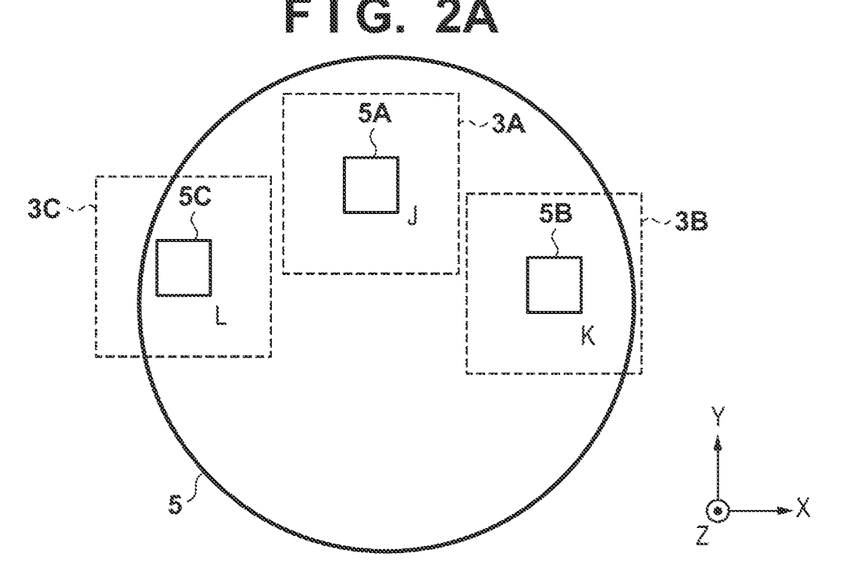
FIGS. 2A to 2C are views showing the positional relationship between a mold and a substrate during contact processes.

FIG. 2A is a view showing the substrate 5 when viewed from above and shows the positional relationship between the mold 3 and the substrate 5 during the contact processes. In FIG. 2A, three shot regions 5A to 5C on the substrate 5 are shown, and the positions of the mold 3 during the contact processes for the shot regions 5A to 5C are indicated by broken lines 3A to 3C, respectively. Here, each of the three shot regions 5A to 5C shown in FIG. 2A is a shot region (also referred to as a full shot region) to which the entire pattern of the pattern region 31 of the mold 3 is transferred. The area (to be also referred to as a facing area, hereinafter) where the mold 3 faces the substrate 5 during the contact process is different between the three shot regions 5A to 5c. The facing area is the area where the mold 3 and the substrate 5 overlap during a contact process when viewed from above. From another point of view, it can be said that the area of the mold 3 arranged outside the substrate 5 during the contact process when viewed from above is different between the three shot regions 5A to 5C.

The shot region 5A is a shot region arranged in the central portion of the substrate 5 such that the entire mold 3 faces the substrate 5 during a contact process. On the other hand, the shot region 5B is a shot region where a part of the mold 3 is located outside the substrate 5 during a contact process and the facing area between the mold 3 and the substrate 5 during the contact process is smaller than that of the shot region 5A. The shot region 5C is a shot region where a part of the mold 3 located outside the substrate 5 during a contact process is further larger compared with the shot region 5B, that is, the facing area between the mold 3 and the substrate 5 during the contact process is smaller than that of the shot region 5B.

Figure 2B:
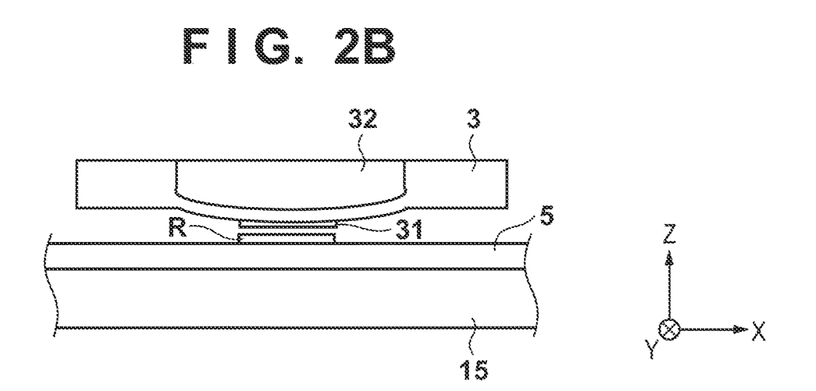
Figure 2C:
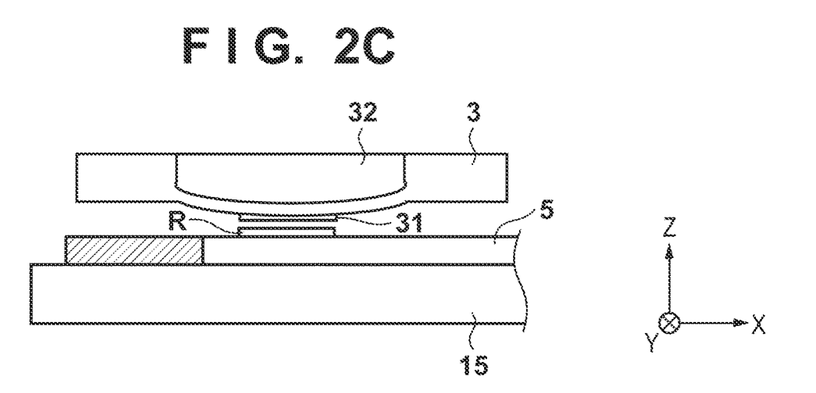

Each of FIGS. 2B and 2C is a view showing the mold 3 and the substrate 5 during the contact process when viewed from a lateral direction. FIG. 2B shows the positional relationship between the mold 3 and the substrate 5 during the contact process for the shot region 5A, and FIG. 2C shows the positional relationship between the mold 3 and the substrate 5 during the contact process for the shot region 5C. Each of FIGS. 2B and 2C shows a state in which the pattern region 31 of the mold 3 is deformed into a convex shape, and the intervals between the mold 3 and the substrate 5 are equal in both views.

In the contact process for the shot region 5A, as shown in FIG. 2B, it is possible to make the entire mold 3 face (oppose) the substrate 5. On the other hand, in the contact process for the shot region 5C, as shown in FIG. 2C, a part of the mold 3 protrudes to the outside of the substrate 5 and faces a structure 15 (for example, the substrate stage 6) outside the substrate 5. In general, the structure 15 located outside the substrate 5 is farther from the mold 3 than the upper surface (the surface on the mold side) of the substrate 5, in order to avoid interference with the mold 3 in a contact process. Therefore, in the contact process for the shot region 5C (FIG. 2C), the space under the mold 3 becomes larger by the volume indicated by hatch lines than in the contact process for the shot region 5A (FIG. 2B).

Here, consider a case in which process conditions are set to be the same in the contact process for the shot region 5A (FIG. 2B) and in the contact process for the shot region 5C (FIG. 2C). The process conditions can include, for example, a force applied to the mold 3 by the deformation unit 8 during the contact process, the relative velocity for bringing the mold 3 and the substrate 5 close to each other, and a pressing force for pressing the mold 3 against an imprint material R. In this case, since the space under the mold 3 is larger in the contact process for the shot region 5C (FIG. 2C), the air pressure in the space under the mold 3 upon bringing the mold 3 and the substrate 5 close to each other is lower than in the contact process for the shot region 5A (FIG. 2B).

The similar tendency applies to the comparison between the shot region 5B and the shot region 5C. That is, as shown in FIG. 2A, the facing area between the mold 3 and the substrate 5 during the contact process is smaller (in other words, the area of a part of the mold 3 facing the structure 15 outside the substrate 5 is larger) in the shot region 5C than in the shot region 5B. Accordingly, in the contact process for the shot region 5C, the space under the mold 3 is larger than in the contact process for the shot region 5B. Therefore, when the process conditions are set to be the same in the contact processes, since the space under the mold 3 is larger in the contact process for the shot region 5C, the air pressure in the space upon bringing the mold 3 and the substrate 5 close to each other is lower than in the contact process for the shot region 5B.

Figure 3A:
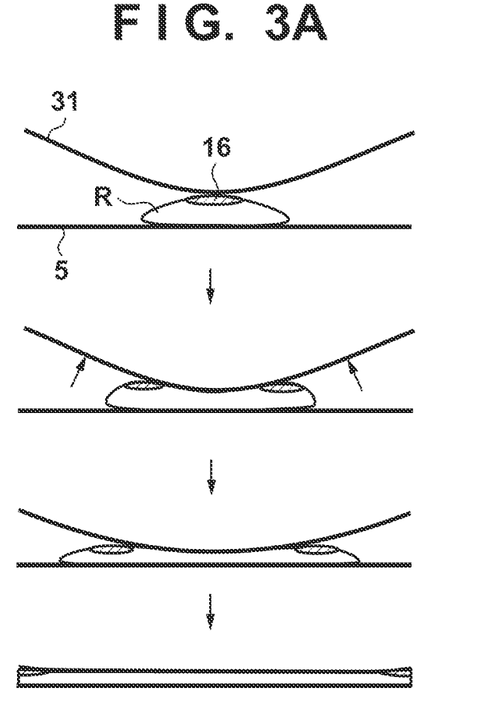
FIGS. 3A to 3D are conceptual views showing the contact processes over time.
Figure 3B:
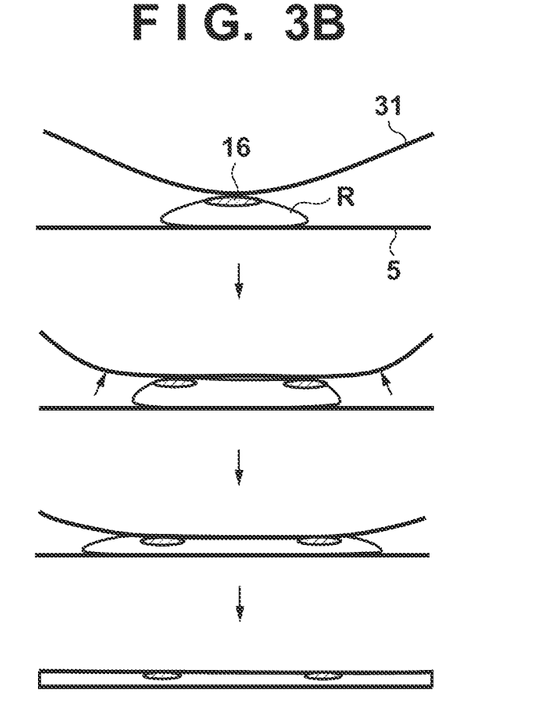

Next, how the imprint material R spreads between the mold 3 and the substrate 5 during the contact process will be described with reference to FIGS. 3A to 3D. FIGS. 3A to 3D are conceptual views showing how the imprint material R spreads during the contact processes over time, and FIGS. 3A and 3B are enlarged views showing the pattern region 31 of the mold 3, the substrate 5, and the imprint material R when viewed from the lateral direction. FIG. 3A shows the contact process for the shot region 5A, and FIG. 3B shows the contact process for the shot region 5C. FIGS. 3A and 3B show the contact processes in which the above-described process conditions are set to be the same, and bubbles 16 generated between the mold 3 and the substrate 5 are also shown.

Figure 3C:
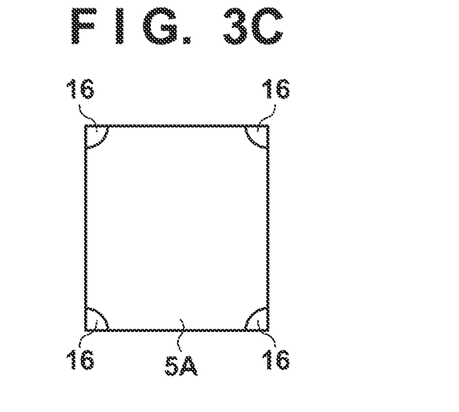

In the contact process for the shot region 5A, as shown in FIG. 3A, the mold 3 is started to be brought into contact with the imprint material R while being deformed into a convex shape by the deformation unit 8, and then the mold 3 gradually returns to the planar shape while pushing the imprint material R outward. In this process, since the air pressure in the space under the mold 3 acts on the mold 3 so as to hinder the mold 3 from returning to the planar shape, it is possible to bring the mold 3 into contact with the imprint material R while maintaining the convex shape of the mold 3. Therefore, in the contact process for the shot region 5A, as shown in FIGS. 3A and 3C, the bubbles 16 generated between the mold 3 and the substrate 5 can be pushed out to the four corners of the shot region 5A. FIG. 3C is a view showing the shot region 5A after the contact process when viewed from above.

Figure 3D:
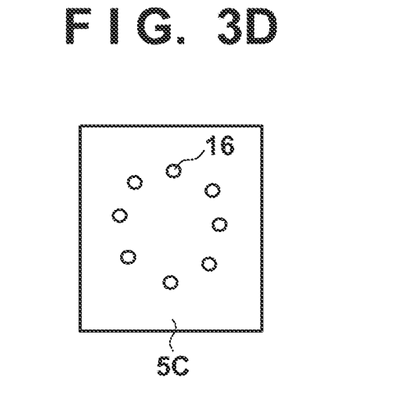

On the other hand, in the contact process for the shot region 5C, since the air pressure in the space under the mold 3 is lower than in the contact process for the shot region 5A, the force that hinders the mold 3 from returning to the planar shape is weak as shown in FIG. 3B. As a result, the mold 3 readily returns to the planar shape before the bubbles 16 generated between the mold 3 and the substrate 5 are pushed out to the four corners of the shot region 5C, and the bubbles 16 may remain inside the shot region 5C as shown in FIG. 3D. In this case, a defect can occur in the pattern formed on the imprint material R. FIG. 3D is a view showing the shot region 5C after the contact process when viewed from above.

As described above, when the air pressure in the space under the mold 3 during the contact process differs between the shot regions, the pressure applied to the mold 3 during the contact process changes, and the shape of the mold 3 during the contact process can also change. As a result, as shown in FIGS. 3A to 3D, the tendency of the remaining bubbles 16 between the mold 3 and the substrate 5 changes between the shot regions.

Hence, the imprint apparatus 1 (control unit 9) of this embodiment changes the process conditions in the contact process between a first shot region and a second shot region onto which the entire pattern of the pattern region 31 of the mold 3 is to be transferred and which have different facing areas with respect to the substrate 5. The process conditions can be changed such that the difference in shape of the pattern region 31 during the contact process is reduced between the first shot region and the second shot region (for example, such that the difference in shape falls within an allowable range). This embodiment will exemplify a case in which switching of the relative velocity for bringing the mold 3 and the substrate 5 close to each other during the contact process is controlled, and the interval between the mold 3 and the substrate 5 for switching the relative velocity is changed between the first shot region and the second shot region as the process condition. Here, in the example shown in FIGS. 2A to 3D, the first shot region is one of the shot regions 5A to 5C, and the second shot region is the other one of the shot regions 5A to 5C.

Contact Process

Figure 4A:
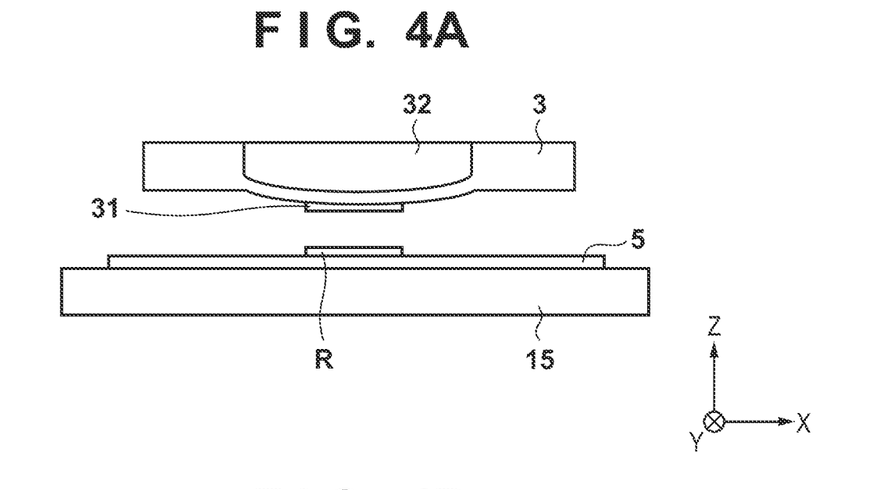
FIGS. 4A to 4C are views showing a mold and a substrate during a contact process.
Figure 4B:
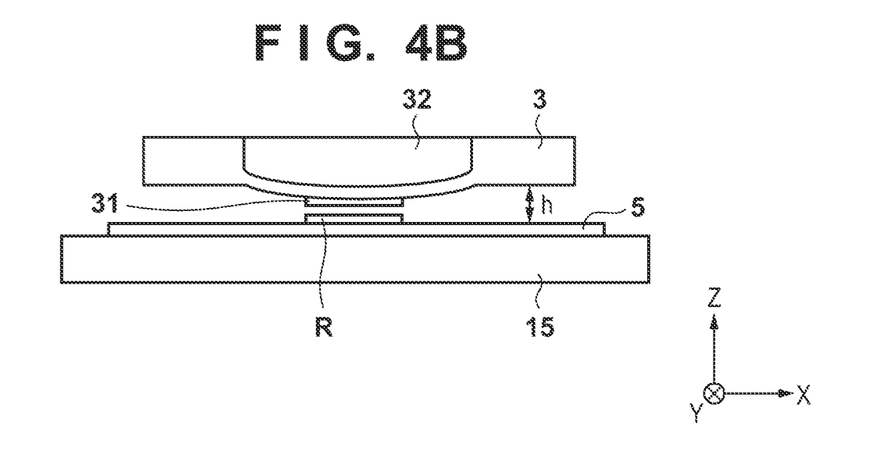
Figure 4C:
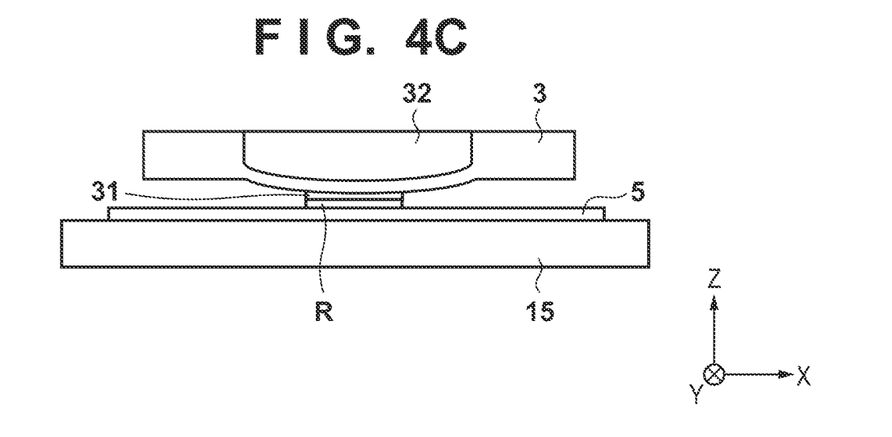

A contact process between the mold 3 and the imprint material R on the substrate in this embodiment will be described with reference to FIGS. 4A to 4C. FIGS. 4A to 4C are views showing the mold 3 and the substrate 5 during the contact process when viewed from the lateral direction. In the contact process of this embodiment, as shown in FIG. 4A, the control unit 9 first causes the deformation unit 8 to deform the mold 3 (pattern region 31) into a convex shape while the mold 3 and the imprint material R on the substrate are not in contact. Then, the mold 3 is lowered by the imprint head 4, and the mold 3 and the substrate 5 are brought close to each other at a first relative velocity v1. When the mold 3 and the substrate 5 are at a predetermine interval h as shown in FIG. 4B, the control unit 9 switches the relative velocity for bringing the mold 3 and the substrate 5 close to each other from the first relative velocity v1 to a second relative velocity v2, and brings the mold 3 and the substrate 5 close to each other at the second relative velocity v2. Thereafter, as shown in FIG. 4C, the mold 3 is brought into contact with the imprint material R on the substrate (that is, the mold 3 is pressed against the imprint material R).

Here, in the following description, the process of bringing the mold 3 and the substrate 5 close to each other at the first relative velocity v1 may be referred to as the "first process", and the process of bringing the mold 3 and the substrate 5 close to each other at the second relative velocity v2 thereafter may be referred to as the "second process". In addition, an interval (distance) between the mold 3 and the substrate 5 for switching the first relative velocity v1 to the second relative velocity v2 may be referred to as the "interval h". Furthermore, in order to avoid that the mold 3 collides with the substrate 5, the relative velocity for bringing the mold 3 and the substrate 5 close to each other is set such that the second relative velocity v2 is lower than the first relative velocity v1.

In the contact process, a gas such as air or helium exists in the space under the mold 3, and as the mold 3 and the substrate 5 are brought closer to each other, the gas in the space is compressed and the air pressure (pressure) increases. The second relative velocity v2 applied in the second process is lower than the first relative velocity v1 applied in the first process. Accordingly, a change in air pressure in the space under the mold 3 in the second process is small, so that the air pressure in the space immediately before the mold 3 contacts the imprint material R on the substrate depends on the change in air pressure (the increase in air pressure) in the first process. Therefore, as the interval h between the mold 3 and the substrate 5 for switching the first relative velocity v1 to the second relative velocity v2 is smaller, the gas in the space under the mold 3 is more compressed and the air pressure can be increased.

Figure 5A:
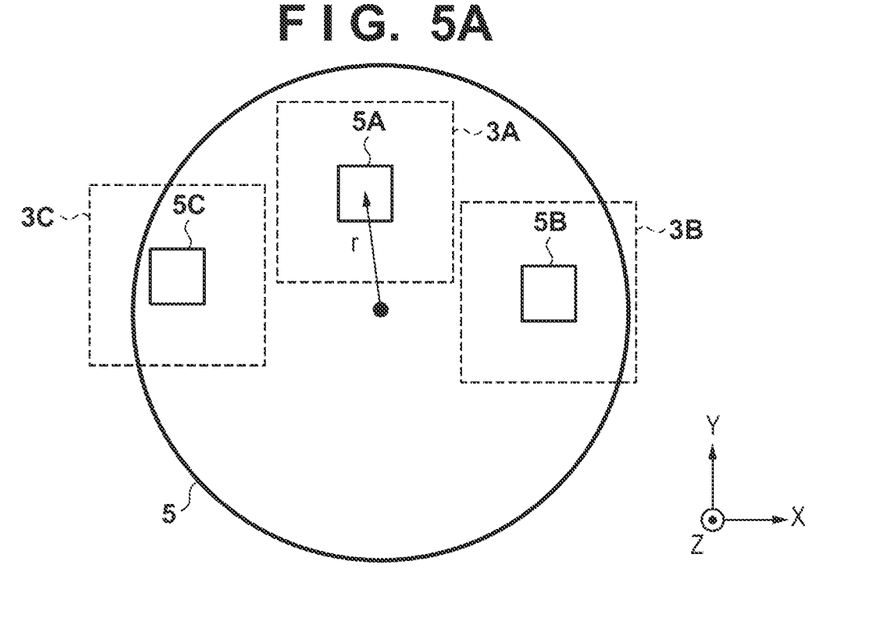
FIGS. 5A to 5C are views showing the positional relationship between a mold and a substrate during contact processes and the relationship between a distance r and an interval h.

FIG. 5A is a view showing the substrate 5 when viewed from above and shows the positional relationship between the mold 3 and the substrate 5 during the contact processes. In FIG. 5A, as in FIG. 2A, the three shot regions 5A to 5C are shown. The entire pattern of the pattern region 31 of the mold 3 is transferred to each of the shot regions 5A to 5C, and the facing area between the mold 3 and the substrate 5 during the contact process is different between the shot regions 5A to 5C. In FIG. 5A, the positions of the mold 3 during the contact processes for the shot regions 5A to 5C are indicated by the broken lines 3A to 3C, respectively. Here, the facing area between the mold 3 and the substrate 5 during the contact process can be determined from the position of the shot region on the substrate. In FIG. 5A, the position (that is, the facing area) of the shot region on the substrate is represented by a distance r from the center (center of gravity) of the substrate 5 to the centroid of the shot region.

Figure 5B:
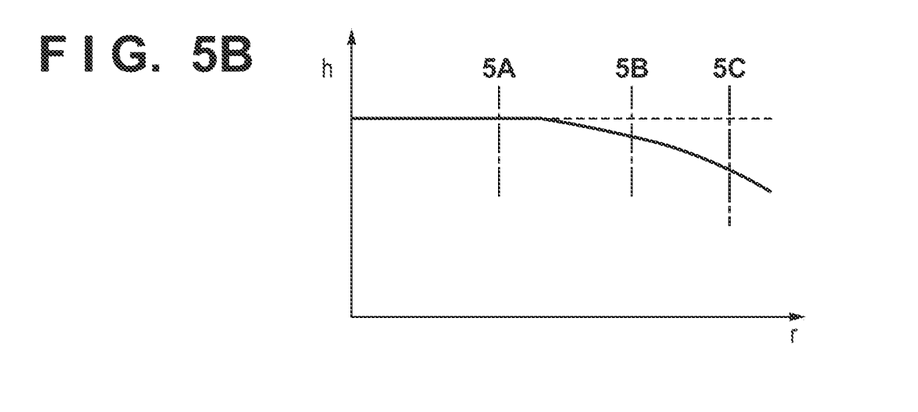
Figure 5C:
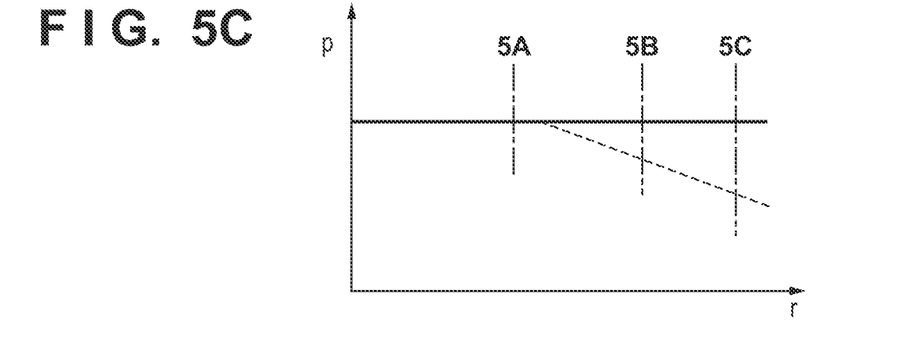

FIG. 5B is a graph showing the relationship between the distance r (that is, the facing area) and the interval h for switching the relative velocity. FIG. 5C is a graph showing the relationship between the distance r (that is, the facing area) and an air pressure p in the space under the mold 3 immediately before the mold 3 contacts the imprint material R on the substrate. Reference numerals "5A to 5C" shown in FIGS. 5B and 5C correspond to the shot regions 5A to 5C shown in FIG. 5A, respectively.

If the interval h is constant as indicated by the broken line in FIG. 5B, for a shot region (for example, the shot region 5A) in which the entire mold 3 faces the substrate 5 during the contact process, the pressure p can be made substantially constant as indicated by the broken line in FIG. 5C. On the other hand, as also indicated by the broken line in FIG. 5C, for a shot region (for example, the shot region 5B or 5C) in which a part of the mold 3 is arranged outside the substrate 5 during the contact process, the pressure p decreases as the distance r is larger (that is, as the facing area is smaller).

Therefore, in order to keep the pressure p constant even when the distance r (that is, the facing area) changes, as indicated by the solid line in FIG. 5C, the interval h for switching the relative velocity may be changed as the process condition in accordance with the distance r. More specifically, as indicated by the solid line in FIG. 5B, for the shot region where a part of the mold 3 is arranged outside the substrate 5 during the contact process, the interval h for switching the relative velocity is decreased as the distance r is larger (that is, as the facing area is smaller).

The relationship between the distance r and the interval h indicated by the solid line in FIG. 5B can be obtained by an experiment, simulation, or the like. The control unit 9 obtains the interval h from the position (distance r or facing area) of a target shot region on the substrate based on the information indicating the relationship, and switches the first process (first relative velocity v1) to the second process (second relative velocity v2) when the mold 3 and the substrate 5 are at the interval h during the contact process. With this operation, for the plurality of shot regions, the air pressure in the space under the mold 3 during a contact process can be made similar, and the difference in shape of the pattern region 31 during a contact process can be reduced. That is, for the plurality of shot regions, the similar effect of pushing out the bubbles between the mold 3 and the substrate 5 during a contact process can be obtained, and the similar tendency of remaining bubbles between the mold 3 and the substrate 5 can be obtained.

As described above, in this embodiment, for the first shot region and the second shot region where the facing areas between the mold 3 and the substrate 5 during the contact processes are different, the interval h between the mold 3 and the substrate 5 for switching the first process to the second process is changed as the process condition. With this operation, the difference in shape of the pattern region 31 during a contact process can be reduced between the first shot region and the second shot region, and the similar tendency of remaining bubbles between the mold 3 and the substrate 5 can be obtained. Here, this embodiment has exemplified a case in which the pattern region 31 of the mold 3 has a mesa shape, but it is not limited to this. For example, even when the pattern region 31 is formed without a mesa shape, a similar effect can be obtained.

Second Embodiment

An imprint apparatus of the second embodiment according to the present invention will be described. The first embodiment has exemplified a case in which the interval h between the mold 3 and the substrate 5 for switching the first process to the second process is used as the process condition and changed between the first shot region and the second shot region. The second embodiment will exemplify a case in which a first relative velocity v1 applied in the first process is used as the process condition and changed between the first shot region and the second shot region. Note that the parts not particularly mentioned in the following description are similar to those in the first embodiment.

Figure 6A:
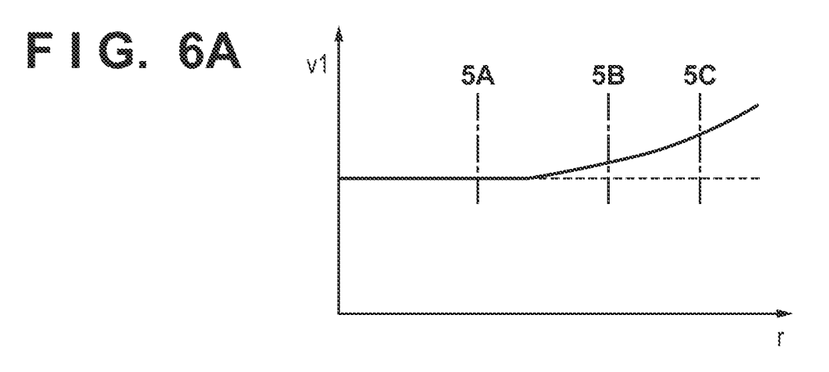
FIGS. 6A and 6B are graphs each showing the relationship between a distance r and a first relative velocity v1.
Figure 6B:
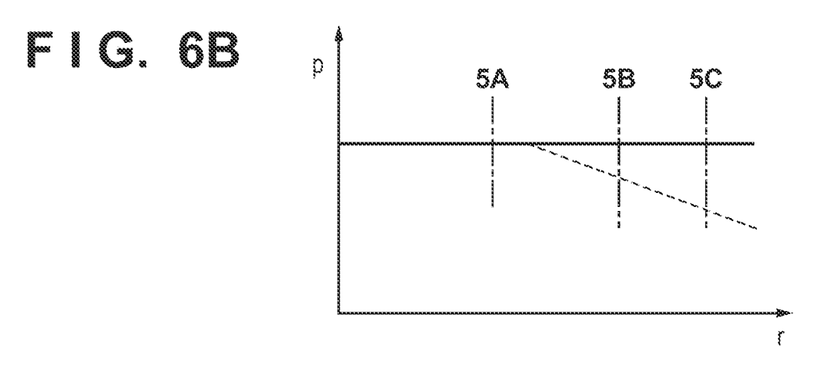

FIG. 6A is a graph showing the relationship between a distance r (that is, the facing area) and the first relative velocity v1 applied in the first process. FIG. 6B is, similar to FIG. 5C, a graph showing the relationship between the distance r (that is, the facing area) and an air pressure p in the space under a mold 3 immediately before the mold 3 contacts an imprint material R on a substrate. Reference numerals "5A to 5C" shown in FIGS. 6A and 6B correspond to the shot regions 5A to 5C shown in FIG. 5A, respectively.

When an interval h is constant as indicated by the broken line in FIG. 6A, for a shot region (for example, the shot region 5A) in which the entire mold 3 faces the substrate 5 during a contact process, the pressure p can be made substantially constant even when the distance r changes, as indicated by the broken line in FIG. 6B. On the other hand, as also indicated by the broken line in FIG. 6B, for a shot region (for example, the shot region 5B or 5C) in which a part of the mold 3 is arranged outside the substrate 5 during a contact process, the pressure p decreases as the distance r is larger (that is, as the facing area is smaller). Therefore, in order to keep the pressure p constant even when the distance r (that is, the facing area) changes as indicated by the solid line in FIG. 6B, the first relative velocity v1 applied in the first process may be changed as the process condition in accordance with the distance r. More specifically, as indicated by the solid line in FIG. 6B, for the shot region where a part of the mold 3 is arranged outside the substrate 5 during the contact process, the first relative velocity v1 is increased as the distance r is larger (that is, as the facing area is smaller).

The relationship between the distance r and the first relative velocity v1 indicated by the solid line in FIG. 6A can be obtained by an experiment, simulation, or the like. A control unit 9 obtains the first relative velocity v1 from the position (distance r or facing area) of the target shot region on the substrate based on the information indicating the relationship, and brings the mold 3 and the substrate 5 close to each other at the first relative velocity v1 in the first process of the contact process. With this operation, for the plurality of shot regions, the air pressure in the space under the mold 3 during a contact process can be made similar, and the difference in shape of a pattern region 31 during a contact process can be reduced. That is, for the plurality of shot regions, the similar effect of pushing out the bubbles between the mold 3 and the substrate 5 during a contact process can be obtained, and the similar tendency of remaining bubbles between the mold 3 and the substrate 5 can be obtained.

As described above, in this embodiment, for the first shot region and the second shot region where the facing areas between the mold 3 and the substrate 5 during the contact processes are different, the relative velocity (first relative velocity v1) for bringing the mold 3 and the substrate 5 close to each other is changed as the process condition. With this operation, as in the first embodiment, the difference in shape of the pattern region 31 during a contact process can be reduced between the first shot region and the second shot region, and the similar tendency of remaining bubbles between the mold 3 and the substrate 5 can be obtained.

Here, in this embodiment, the interval h between the mold 3 and the substrate 5 for switching the first process (first relative velocity v1) to the second process (second relative velocity v2) is made constant, and the first relative velocity v1 applied in the first process can be changed in accordance with the distance r of a target shot region. However, this embodiment is not limited to this, and the first embodiment may be combined therewith. More specifically, in addition to the first relative velocity v1, the interval h may be changed in accordance with the distance r of the target shot region. Furthermore, in this embodiment, only the first relative velocity v1 is changed in accordance with the distance r of the target shot region, but a second relative velocity v2 applied in the second process may also be changed in accordance with the distance r.

Third Embodiment

An imprint apparatus of the third embodiment according to the present invention will be described. This embodiment will exemplify a case in which a force q applied to a mold 3 by a deformation unit 8 is used as the process condition and changed between the first shot region and the second shot region. More specifically, the force q is the pressure applied to a cavity 32 of the mold 3 by the deformation unit 8 in order to deform a pattern region 31 of the mold 3 into a convex shape before the mold 3 is started to be brought into contact with an imprint material R on a substrate. Note that the parts not particularly mentioned in the following description are similar to those in the first embodiment.

Figure 7:
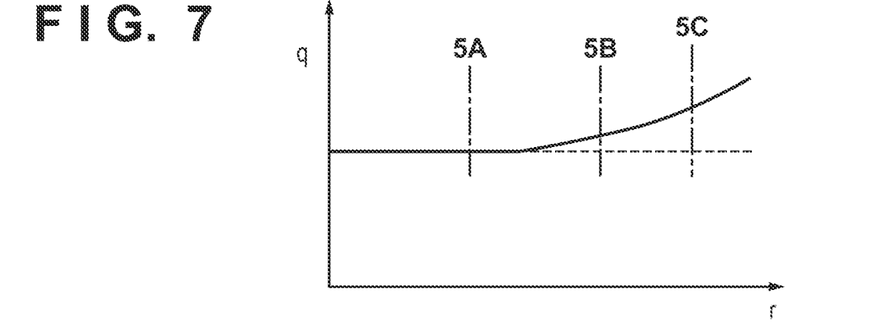
FIG. 7 is a graph showing the relationship between a distance r and a force q.

FIG. 7 is a graph showing the relationship between a distance r (that is, the facing area) and the force q applied to the mold 3 by the deformation unit 8. Reference numerals "5A to 5C" shown in FIG. 7 correspond to the shot regions 5A to 5C shown in FIG. 5A, respectively. In this embodiment, as indicated by the solid line in FIG. 7, for a shot region (for example, the shot region 5A) in which the entire mold 3 faces the substrate 5 during a contact process, the force q is constant even when the distance r changes. For a shot region (for example, the shot region 5B or 5C) in which a part of the mold 3 is arranged outside the substrate 5 during a contact process, the force q is increased as the distance r is larger (that is, as the facing area is smaller).

As described in the first embodiment, in the shot region where a part of the mold 3 is arranged outside the substrate during a contact process, the air pressure in the space under the mold 3 is lower than in the shot region where the entire mold 3 faces the substrate 5, so that the mold 3 readily returns to the planar shape. Therefore, when the force q applied to the mold 3 by the deformation unit 8 is increased, the increased amount of the force q acts as a resistance force that hinders the mold 3 from returning to the planar shape from the convex shape during the contact process, so that it can become hard for the mold 3 to return to the planar shape.

The relationship between the distance r and the force q indicated by the solid line in FIG. 7 can be obtained by an experiment, simulation, or the like. The control unit 9 obtains the force q from the position (distance r or the facing area) of a target shot region on the substrate based on the information indicating the relationship, and controls the deformation unit 8 to deform the pattern region 31 into a convex shape by applying the obtained force q to the mold 3. With this operation, for the plurality of shot regions, the similar effect of pushing out the bubbles between the mold 3 and the substrate 5 during a contact process can be obtained, and the similar tendency of remaining bubbles between the mold 3 and the substrate 5 can be obtained.

As described above, in this embodiment, for the first shot region and the second shot region where the facing areas between the mold 3 and the substrate 5 during the contact processes are different, the force q applied to the mold 3 by the deformation unit 8 is changed as the process condition. With this operation, as in the first embodiment, the difference in shape of the pattern region 31 during a contact process can be reduced between the first shot region and the second shot region, and the similar tendency of remaining bubbles between the mold 3 and the substrate 5 can be obtained. Here, at least one of the first and second embodiments may be combined with the third embodiment. More specifically, in addition to the force q applied to the mold 3 by the deformation unit 8, at least one of an interval h and a relative velocity (for example, a first relative velocity v1) may be changed in accordance with the distance r of the target shot region.

Fourth Embodiment

An imprint apparatus of the fourth embodiment according to the present invention will be described. This embodiment will exemplify a case in which a pressing force for pressing a mold 3 (a pattern region 31) against an imprint material R on a substrate during a contact process is used as the process condition and changed between the first shot region and the second shot region. Note that the parts not particularly mentioned in the following description are similar to those in the first embodiment.

Figure 8:
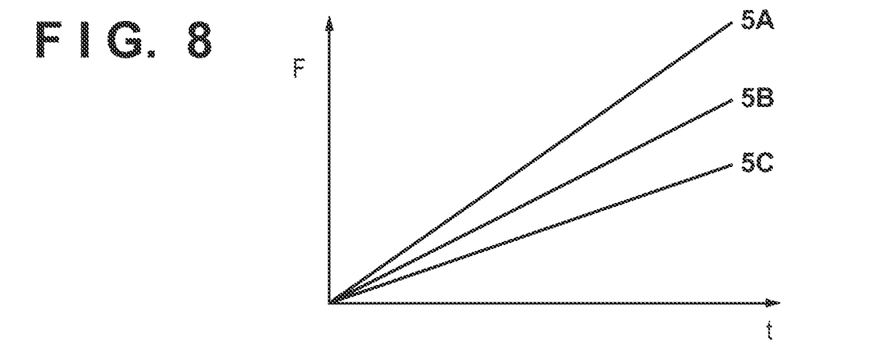
FIG. 8 is a graph showing temporal changes in a pressing force F.

FIG. 8 is a graph showing temporal changes in a pressing force F for pressing the pattern region 31 against the imprint material R on the substrate during a contact process. In FIG. 8, the abscissa represents an elapsed time t from the start of the contact between the mold 3 and the imprint material R on the substrate, and the ordinate represents the pressing force F generated by an imprint head 4. Further, FIG. 8 shows a temporal change in the pressing force F from the start of the contact between the mold 3 and the imprint material R on the substrate, for each of the shot regions 5A to 5C shown in FIG. 5A.

In this embodiment, the pressing force F is decreased as the distance r is larger (that is, as the facing area is smaller). In the example shown in FIG. 8, as the distance r is larger, the change rate of the pressing force F with respect to the elapsed time t is decreased. More specifically, during a contact process for the shot region 5B, the change rate of the pressing force F is lower than during a contact process for the shot region 5A. Further, during a contact process for the shot region 5C, the change rate of the pressing force F is lower than during the contact process for the shot region 5B.

As described in the first embodiment, in the shot region where a part of the mold 3 is arranged outside the substrate 5 during a contact process, the air pressure in the space under the mold 3 is lower than in the shot region where the entire mold 3 faces the substrate 5, so that the mold 3 readily returns to the planar shape. Accordingly, the mold 3 returns to the planar shape before the bubbles generated between the mold 3 and the substrate 5 are pushed out to the outside, so that the bubbles are likely to remain between the mold 3 and the substrate 5. Therefore, by decreasing the change rate of the pressing force F with respect to the elapsed time t as the distance r is larger (that is, as the facing area is smaller), it is possible to delay the return of the mold 3 from the convex shape to the planar shape. Here, in FIG. 8, the pressing force F changes linearly with respect to the elapsed time t, but this is an example, and the pressing force F may not change linearly as long as it is monotonically increased with respect to the elapsed time t.

The relationship between the elapsed time t and the pressing force F shown in FIG. 8 can be obtained by an experiment, simulation, or the like, for each of the plurality of shot regions on the substrate 5. The control unit 9 selects information indicating the relationship between the elapsed time t and the pressing force f for a target shot region, and controls the imprint head 4 in accordance with the selected information. With this operation, for the plurality of shot regions, the similar effect of pushing out the bubbles between the mold 3 and the substrate 5 during a contact process can be obtained, and the similar tendency of remaining bubbles between the mold 3 and the substrate 5 can be obtained.

As described above, in this embodiment, for the first shot region and the second shot region where the facing areas between the mold 3 and the substrate 5 during the contact processes are different, the pressing force F during a contact process is changed as the process condition. With this operation, as in the first embodiment, the difference in shape of the pattern region 31 during a contact process can be reduced between the first shot region and the second shot region, and the similar tendency of remaining bubbles between the mold 3 and the substrate 5 can be obtained. Here, at least one of the first to third embodiments may be combined with the fourth embodiment. More specifically, in addition to the pressing force F, at least one of an interval h, a relative velocity (for example, a first relative velocity v1), and a force q may be changed in accordance with the distance r of the target shot region.

An imprint apparatus that performs pattern formation on a substrate by forming (molding) an imprint material on the substrate using a mold (die) has been described as an example of the forming apparatus, but the present invention is not limited to the imprint apparatus. A planarizing apparatus that performs a planarizing process (forming process) for forming a composition on a substrate to be planarized using a mold (blank template) including a flat portion without an uneven pattern as a die may be used as an example of the forming apparatus.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing the article according to this embodiment includes a step of forming a pattern on an imprint material supplied (dispensed) onto a substrate using the above-described imprint apparatus (imprint method), and a step of processing the substrate on which the pattern has been formed in the preceding step. This manufacturing method further includes other known steps (oxidation, deposition, vapor deposition, doping, planarization, etching, resist separation, dicing, bonding, packaging, and the like). The method of manufacturing the article according to this embodiment is advantageous in at least one of the performance, the quality, the productivity, and the production cost of the article, as compared to a conventional method.

The pattern of a cured product formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 9A:
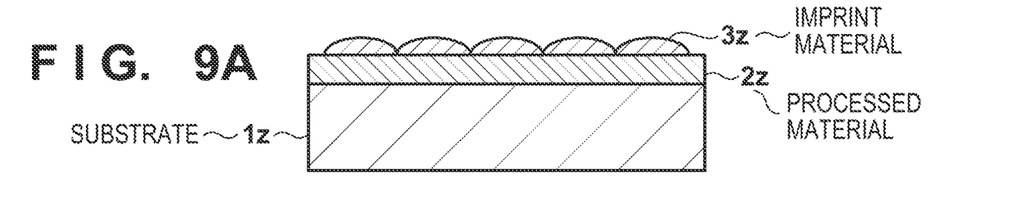
FIGS. 9A to 9F are views illustrating a method of manufacturing an article.

A detailed method of manufacturing an article will be described next. As shown in FIG. 9A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 9B:
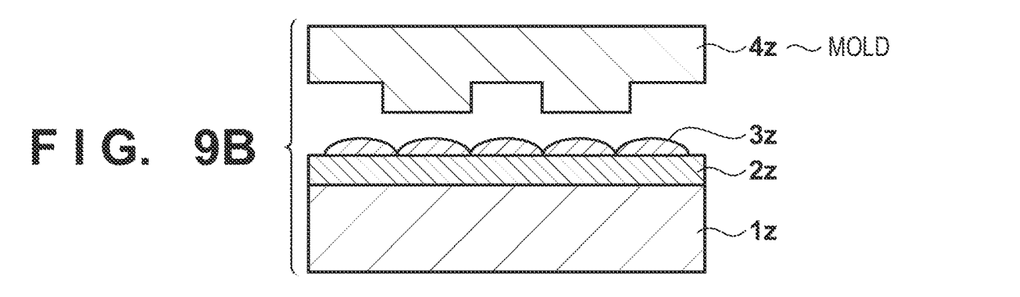
Figure 9C:
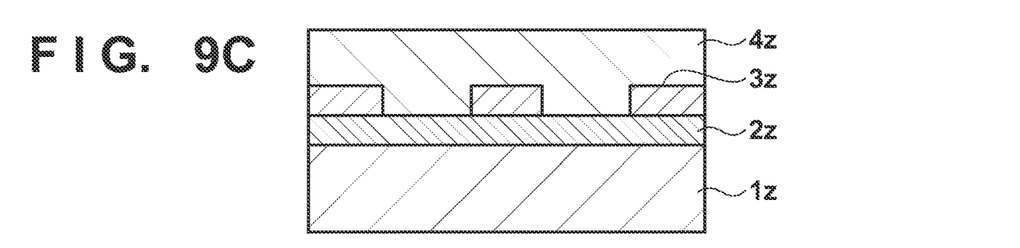

As shown in FIG. 9B, a side of a mold 4z for imprint with an uneven pattern is directed to and caused to face the imprint material 3z on the substrate. As shown in FIG. 9C, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with energy for curing through the mold 4z, the imprint material 3z is cured.

Figure 9D:
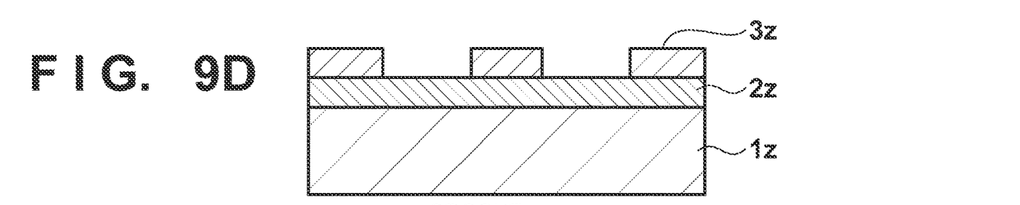

As shown in FIG. 9D, after the imprint material 3z is cured, the mold 4z is separated from the substrate 1z. Then, the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the uneven pattern of the mold 4z is transferred to the imprint material 3z.

Figure 9E:
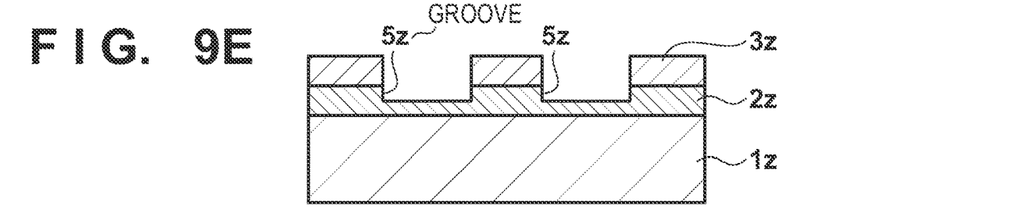
Figure 9F:
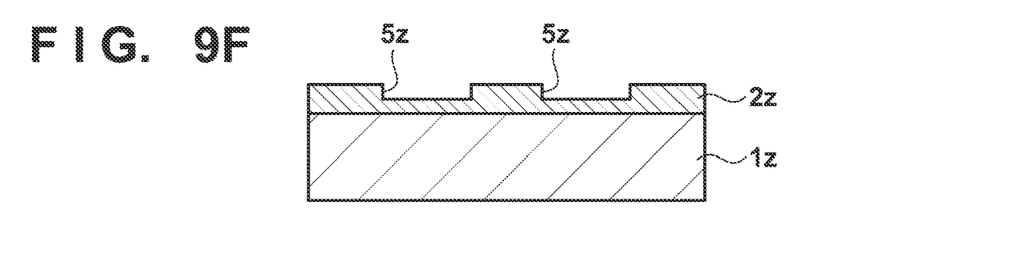

As shown in FIG. 9E, when etching is performed using the pattern of the cured product as an etching resistant mask, a portion of the surface of the processed material 2z where the cured product does not exist or remains thin is removed to form a groove 5z. As shown in FIG. 9F, when the pattern of the cured product is removed, an article with the grooves 5z formed in the surface of the processed material 2z can be obtained. Here, the pattern of the cured product is removed. However, instead of processing or removing the pattern of the cured product, it may be used as, for example, an interlayer dielectric film included in a semiconductor element or the like, that is, a constituent member of an article.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-191272 filed on Oct. 9, 2018, which is hereby incorporated by reference herein in its entirety.

What is claimed is:

1. A forming apparatus that forms a composition on a substrate using a mold including a contact region, wherein the contact region is a part of the mold and is brought into contact with the composition on the substrate, comprising:
    a deformation unit configured to deform the contact region so as to bend toward the substrate by applying a deformation force to the mold; and
    a controller configured to perform, for each of a plurality of shot regions on the substrate, a contact process of bringing the contact region and the composition on the substrate into contact with each other by decreasing an interval between the mold and the substrate while controlling the deformation of the contact region by the deformation unit,
    wherein the plurality of shot regions includes a first shot region and a second shot region each of which is brought into contact with the entire contact region via the composition, the first shot region and the second shot region being located on the substrate such that a size of a facing area where the mold and the substrate face each other during the contact process for the first shot region is different from a size of a facing area where the mold and the substrate where the mold and the substrate face each other during the contact process for the second shot region, and
    wherein the controller is configured to change a process condition of the contact process between the first shot region and the second shot region, based on a size difference of the facing area during the contact process between the first shot region and the second shot region.

2. The apparatus according to claim 1, wherein the controller is configured to:
    control the contact process so as to bring the mold and the substrate close to each other at a first relative velocity so as to decrease the interval, switch the first relative velocity to a second relative velocity lower than the first relative velocity when the interval reaches a target interval, and then bring the mold and the substrate close to each other at the second relative velocity so as to decrease the interval, and
    change the target interval, as the process condition.

3. The apparatus according to claim 2, wherein the controller is configured to change the process condition so as to decrease the target interval as the size of the facing area is smaller.

4. The apparatus according to claim 1, wherein the controller is configured to change a relative velocity for relatively driving the mold and the substrate so as to decrease the interval, as the process condition.

5. The apparatus according to claim 1, wherein the controller is configured to:
    control the contact process so as to bring the mold and the substrate close to each other at a first relative velocity so as to decrease the interval, switch the first relative velocity to a second relative velocity lower than the first relative velocity when the interval reaches a target interval, and then bring the mold and the substrate close to each other at the second relative velocity so as to decrease the interval, and
    change the first relative velocity, the second relative velocity, or the first relative velocity and the second relative velocity, as the process condition.

6. The apparatus according to claim 4, wherein the controller is configured to change the process condition so as to increase the relative velocity as the size of the facing area is smaller.

7. The apparatus according to claim 1, wherein the controller is configured to change the deformation force applied to the mold by the deformation unit, as the process condition.

8. The apparatus according to claim 7, wherein the controller is configured to change the process condition so as to increase the deformation force as the size of the facing area is smaller.

9. The apparatus according to claim 1, wherein the controller is configured to change a pressing force for pressing the contact region of the mold against the composition on the substrate, as the process condition.

10. The apparatus according to claim 9, wherein the controller is configured to change the process condition so as to decrease the pressing force as the size of the facing area is smaller.

11. The apparatus according to claim 1, wherein the controller is configured to change the process condition between the first shot region and the second shot region so as to reduce a shape difference between the contact region in the contact process for the first shot region and the contact region in the contact process for the second shot region.

12. The apparatus according to claim 1, wherein
the contact region includes a pattern to be transferred to the composition on the substrate, and
the apparatus forms a pattern of the composition on the substrate by bringing the contact region of the mold into contact with the composition on the substrate.

13. The apparatus according to claim 1, wherein
the contact region is a flat surface, and
the apparatus planarizes the composition by bringing the contact region of the mold into contact with the composition on the substrate.

14. The apparatus according to claim 1, wherein
the contact process includes a first process of decreasing the interval by relatively driving the mold and the substrate at a first relative velocity, and a second process of decreasing the interval by relatively driving the mold and the substrate at a second relative velocity lower than the first relative velocity, the first process being switched to the second process when the interval reaches a target interval,
the process condition includes at least one of the target interval, the first relative velocity, the second relative velocity, the deformation force, and a pressing force of pressing the contact region of the mold against the composition on the substrate in the contact process.

15. The apparatus according to claim 1, wherein the facing area is an area where the mold and the substrate overlap during the contact process when the substrate is viewed from above.

16. The apparatus according to claim 1, wherein the contact region has a mesa shape formed as a level difference from a region other than the contact region in the mold.

* * * * *